US007355453B2

(12) United States Patent
Watt (10) Patent No.: US 7,355,453 B2
(45) Date of Patent: Apr. 8, 2008

(54) TECHNIQUES FOR TRIMMING DRIVE CURRENT IN OUTPUT DRIVERS

(75) Inventor: Jeffrey Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 25 days.

(21) Appl. No.: 10/916,908

(22) Filed: Aug. 11, 2004

(65) Prior Publication Data

US 2006/0033532 A1    Feb. 16, 2006

(51) Int. Cl.
*H03K 19/094* (2006.01)
(52) U.S. Cl. ............................ 326/87; 326/37; 326/30; 327/170; 327/112; 327/374
(58) Field of Classification Search ............... 326/87; 327/112
See application file for complete search history.

(56) References Cited

U.S. PATENT DOCUMENTS

| | | | |
|---|---|---|---|
| 5,663,664 A | | 9/1997 | Schnizlein |
| 5,821,783 A | * | 10/1998 | Torimaru et al. ............ 327/108 |
| 5,926,034 A | * | 7/1999 | Seyyedy ..................... 326/37 |
| 6,114,895 A | * | 9/2000 | Stephens .................... 327/391 |
| 6,377,069 B1 | * | 4/2002 | Veenstra et al. ............. 326/38 |
| 6,445,245 B1 | * | 9/2002 | Schultz et al. .............. 327/541 |
| 6,466,487 B1 | * | 10/2002 | Otsuka .................. 365/189.05 |
| 6,894,547 B2 | * | 5/2005 | Takahashi ................... 327/170 |
| 2002/0093363 A1 | | 7/2002 | Wey et al. |
| 2003/0112042 A1 | * | 6/2003 | Takahashi ................... 327/112 |

OTHER PUBLICATIONS

"Three-transistor One-Time Programmable (OTP) ROM Cell Array Using Standard CMOS Gate Oxide Antifuse," IEEE Electron Device Letters 24:589-591 (Sep. 2003).
"Using Selectable I/O Standards in Stratix & Stratix GX Devices," product technical information from Altera Corporation San Jose, CA (Nov. 2003).

* cited by examiner

*Primary Examiner*—Vibol Tan
(74) *Attorney, Agent, or Firm*—Townsend and Townsend and Crew LLP (57) ABSTRACT

Techniques are provided for trimming drive current in output drivers to compensate for process variations, model inaccuracies, and/or an off-target process. The actual output drive current is measured on the integrated circuit (IC) at wafer sort or during a final test. Based on the measured output drive current, the total transistor width that is required in the output driver to meet an I/O standard is calculated. A control block controls trimming transistors that are coupled in parallel with main output drive transistors. The control block adjusts the total width of the output drive transistors to bring the total width as close as possible to the desired width. Each I/O driver on a die can be adjusted individually based on its own drive current characteristics. All I/O drivers on a die can be adjusted by the same transistor width based on a single I/O measurement or on multiple I/O measurements.

18 Claims, 10 Drawing Sheets

TECHNIQUES FOR TRIMMING DRIVE CURRENT IN OUTPUT DRIVERS

BACKGROUND OF THE INVENTION

The present invention relates to techniques for trimming drive current in output drivers, and more particularly, to techniques for trimming drive current in output drivers to compensate for process variations and other abnormalities.

Integrated circuits (ICs) typically contain output drivers that drive output signals from inside the chip to an external terminal for transmission off-chip. An output driver has at least one pull-up transistor and at least one pull-down transistor. These transistors are used to drive digital signals to an external terminal (also called a pad).

The channel width-to-length (W/L) ratios (i.e., sizes) of the pull-up and pull-down transistors are typically chosen to meet a specific input/output (I/O) standard. Examples of I/O standards are LVTTL, LVCMOS, HSTL, GTL, and LVDS. Some integrated circuits support multiple version of an I/O standard for different supply voltages. For example, some ICs support 1.8 volt, 2.5 volt, and 3.3 volt standards for LVTTL I/Os.

In application specific integrated circuits (ASICs), the pull-up and pull-down transistors in the output drivers are a fixed size. In programmable logic integrated circuits, a customer can select from a variety of I/O standards. The programmable logic IC can be configured to connect appropriately sized output driver transistors to an I/O pad to meet the requirements of a selected I/O standard.

Circuit simulations are used to determine the transistor dimensions required to meet an I/O standard. However, the actual drive current of the pull-up and pull-down transistors in output drivers can differ significantly from design targets, because device models often contain inaccuracies, and the wafer fabrication process varies. Variations in output drive currents occur across a single die, as well as from die-to-die.

For a well-controlled process, the variation in drive current can be +/−10% and the nominal drive current may be 3% off target. For a poorly controlled process, the variation in drive current from a target value can be significantly larger. The process variation and the deviation of the process median from target are accounted for in the design process by running corner simulations that predict the behavior of devices and circuits across the expected worst-case range of outcomes from the wafer fabrication process.

The goal of prior art techniques is to ensure by design that the I/O drivers operate correctly within normal process variations. Designing an I/O driver that operates correctly within larger process variations typically involves some compromises that may reduce the performance or increase the area of the I/O driver. For example, the maximum speed of an I/O driver may be limited to ensure that requirements are met for the slowest corner of the process.

Variations in I/O characteristics cause system designers to build margin into a system so that it works correctly with the worst possible process variation. High speed I/O drivers, in particular, must have a well controlled output impedance to match the impedance of the transmission line and/or the receiver being driven. However, building margin into a system may degrade the performance or increase the cost of the system.

Inaccuracies in the models as well as drift in the process can cause the model prediction of a typical output drive current to deviate from the actual drive current observed on silicon. With the prior art approach, the only way to adjust the typical output drive current to match a target is to change a mask to modify the output transistor geometry or to change the process to put the output drive current on target.

Therefore, it would be desirable to provide techniques for adjusting the drive current of output drivers to compensate for process variations, model inaccuracies, and other abnormalities that do not require changes to a mask or the process.

BRIEF SUMMARY OF THE INVENTION

The present invention provides techniques for trimming drive current in output drivers to compensate for process variations, model inaccuracies, and/or an off-target process. The actual output drive current is measured on the integrated circuit (IC) at wafer sort or during a final test. Based on the measured output drive current, the total transistor width that is required in the output driver to meet an I/O standard is calculated.

A control block on the die controls trimming transistors that are coupled in parallel with main output drive transistors. The control block adjusts the width of the output driver transistors to bring the total transistor width as close as possible to the desired width. The techniques of the present invention can be used to adjust each I/O on a die individually based on its own drive current characteristics. The techniques of the present invention can also be used to adjust a group of I/O drivers on a die by the same transistor width based on a single I/O measurement or on multiple I/O measurements.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
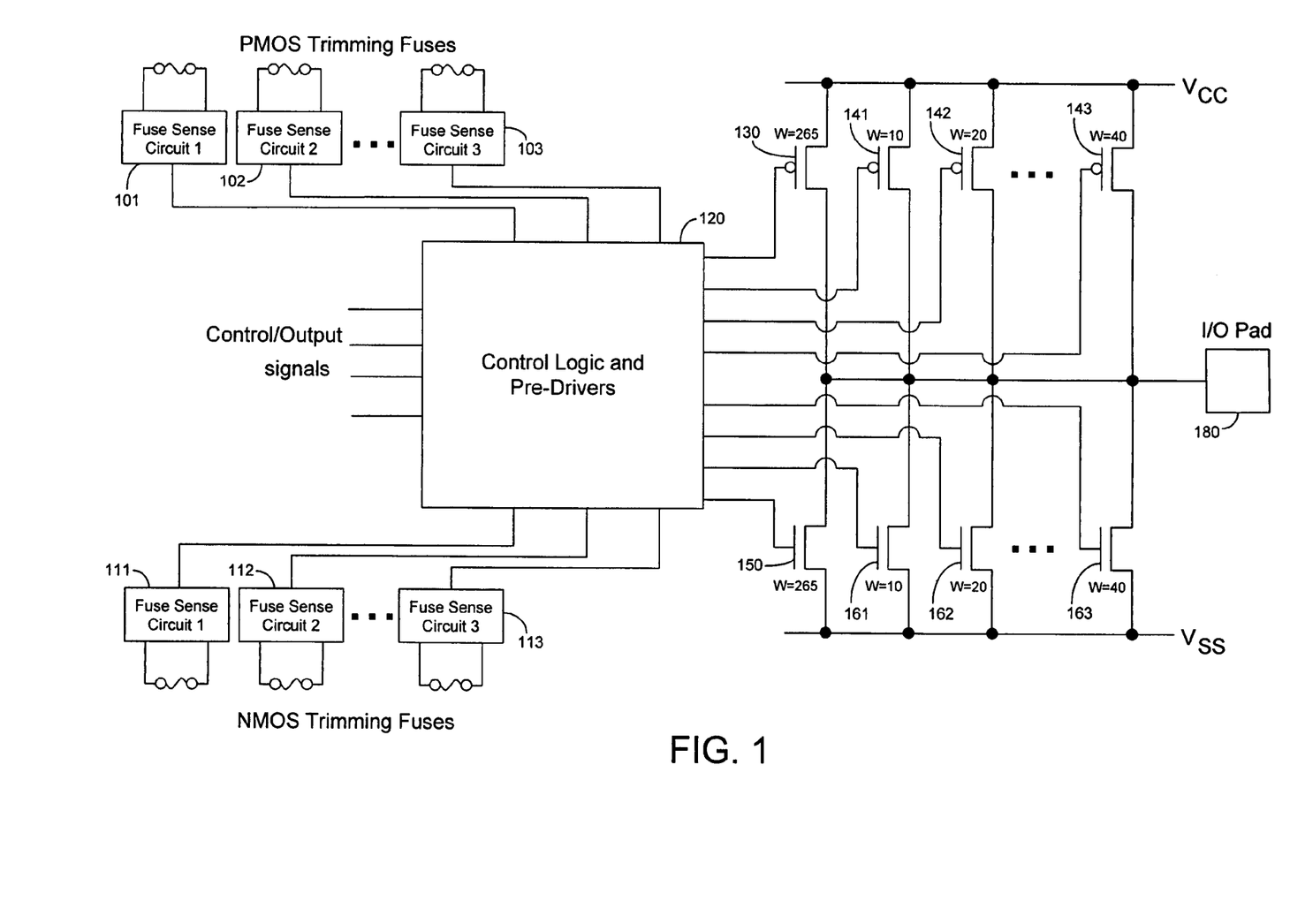
FIG. 1 illustrates an output driver with an adjustable drive current according to a first embodiment of the present invention.

FIG. 1 illustrates an output driver circuit with an adjustable drive current according to a first embodiment of the present invention. FIG. 1 illustrates fuse sense circuits 101-103 and 111-113. Each fuse sense circuit is coupled to a fuse. Only six fuse sense circuits are shown in FIG. 1 so as not to overcomplicate the drawing. It should be understood that any appropriate number of fuse sense circuit can be used to implement embodiment of the present invention.

Each of the fuse sense circuits controls logic and pre-driver circuit block 120. Each fuse sense circuit is also coupled to a fuse. The fuses can be on-chip fuses or off-chip fuses. The fuses can be, for example, electrical fuses or laser fuses. An electrical fuse can be fabricated on a semiconductor die, for example, on a metal or polysilicon layer. An electrical fuse is blown by driving a large current through the fuse. A laser fuse is blown by a laser. Other types of fuses and methods of storing data can be used as well. For example, as discussed below, memory elements could be used in place of the fuses.

The output driver includes any number of pull-up and pull-down transistors. The pull-up and pull-down transistors can be turned on and off to drive digital output signals to input/output (I/O) pad 180. The output driver includes main output drive pull-up transistor 130, main output drive pull-down transistor 150, trimming transistors 141-143, and trimming transistors 161-163. Drivers in control block 120 drive data signals to output pad 180 through transistors 130 and 150 and the trimming transistors that are enabled.

Drivers in block 120 are coupled to the gates of each of the pull-up and pull-down transistors. The drivers drive data output signals to I/O pad 180 by controlling the gate voltages of the pull-up and pull-down transistors. The pull-up and pull-down transistors can also be configured to act as termination impedances.

The output driver includes any number N of pull-up trimming transistors and any number N of pull-down trimming transistors. Only three pull-up trimming transistors 141, 142, and 143 and three pull-down trimming transistors 161, 162, and 163 are shown in FIG. 1 so as not to overcomplicate the drawing. The trimming and main drive transistors can be field effect transistors (FETs).

Each one of the fuse sense circuits corresponds to one of the trimming transistors. The output driver has a first set of N fuse sense circuits that correspond to the pull-up trimming transistors, and a second set of N fuse sense circuits that correspond to the pull-down trimming transistors. Thus, the output driver has a total of 2N fuse sense circuits that are coupled to 2N corresponding fuses. The fuses do not need to correspond one-to-one with the trimming transistors. Instead, a design trade off can be made wherein less than all of the trimming transistors can be controlled by the fuses.

For example, fuse sense circuit 101 corresponds to transistor 141, fuse sense circuit 102 corresponds to transistor 142, and fuse sense circuit 103 corresponds to transistor 143. Fuse sense circuit 111 corresponds to transistor 161, fuse sense circuit 112 corresponds to transistor 162, and fuse sense circuit 113 corresponds to transistor 163.

The fuses are used to determine which of the trimming transistors are enabled through the I/O control logic in block 120. A fuse is blown to enable one or more trimming transistors to be turned on by a pre-driver.

For example, when the fuses coupled to sense circuits 101 and 111 are blown, the control logic in block 120 enables trimming transistors 141 and 161, respectively. As another example, the fuses coupled to circuits 102 and 112 can be blown to enable trimming transistors 142 and 162, respectively. A subset of the trimming transistors are enabled to increase the total effective width of the transistors that drive signals to pad 180. Increasing the total effective width of the drive transistors increases the drive current to pad 180. Fuses 101 and 111 do not need to be blown together, and circumstances may exist under which only one of the pair of fuses would be blown.

A fuse is purposely not blown to disable the corresponding trimming transistor and to prevent a pre-driver from turning on that trimming transistor. For example, if the fuses coupled to sense circuits 103 and 113 are not blown, the control logic in block 120 disables trimming transistors 143 and 163, respectively. When particular trimming transistors are disabled, the pre-driver circuitry cannot turn these disabled transistors on.

The total drive current characteristics of an output driver can be controlled by selecting which fuses are blown. By blowing selected fuses, one or more trimming transistors can be enabled to increase the total drive current provided to pad 180. In this way, the output drive current can be adjusted to meet the specifications of a particular I/O standard, and at the same time, to compensate for process variations.

According to alternative embodiments of the present invention, the trimming transistors are initially enabled when the fuses are not blown. One or more of the trimming transistors can be disabled by blowing one or more corresponding fuses. This alternative embodiment can be applied to any of the specific designs described herein and other designs that fall within the scope of the present invention.

According to another embodiment of the present invention, the fuse sense circuits and the trimming transistors do not have a 1:1 correspondence. Instead, the states of the fuses represent a binary encoded value. The control logic in block 120 decodes the binary value and uses the decoded bits to enable or disable the trimming transistors.

When the output signals of the fuse sense circuits are decoded, N fuse sense circuits can control N trimming transistors, or more than N trimming transistors. For example, if the output signals of the fuse sense circuits are decoded, 3 fuses can control 8 trimming transistors. Eight trimming transistors have $2^8$ (256) possible combinations of ON/OFF states. In this example, only 8 of the possible ON/OFF states can be allowed, because 3 fuses can only be used to generate $2^3$ unique signals.

As another example, signals generated by 8 fuses can be decoded and used to control 8 trimming transistors. In this example, all 256 of the possible combinations of ON/OFF states of the 8 trimming transistors can be allowed. The design choice is merely a trade off between decode circuitry and fuse sense circuitry.

According to another embodiment of the present invention, each fuse sense circuit corresponds to a pull-up and a pull-down transistor. For example, if the fuse coupled to circuit 101 is blown, pull-up transistor 141 and pull-down transistor 161 are enabled. If the fuse coupled to circuit 102 is not blown, pull-up transistor 142 and pull-down transistor 162 are disabled.

Figure 2A:
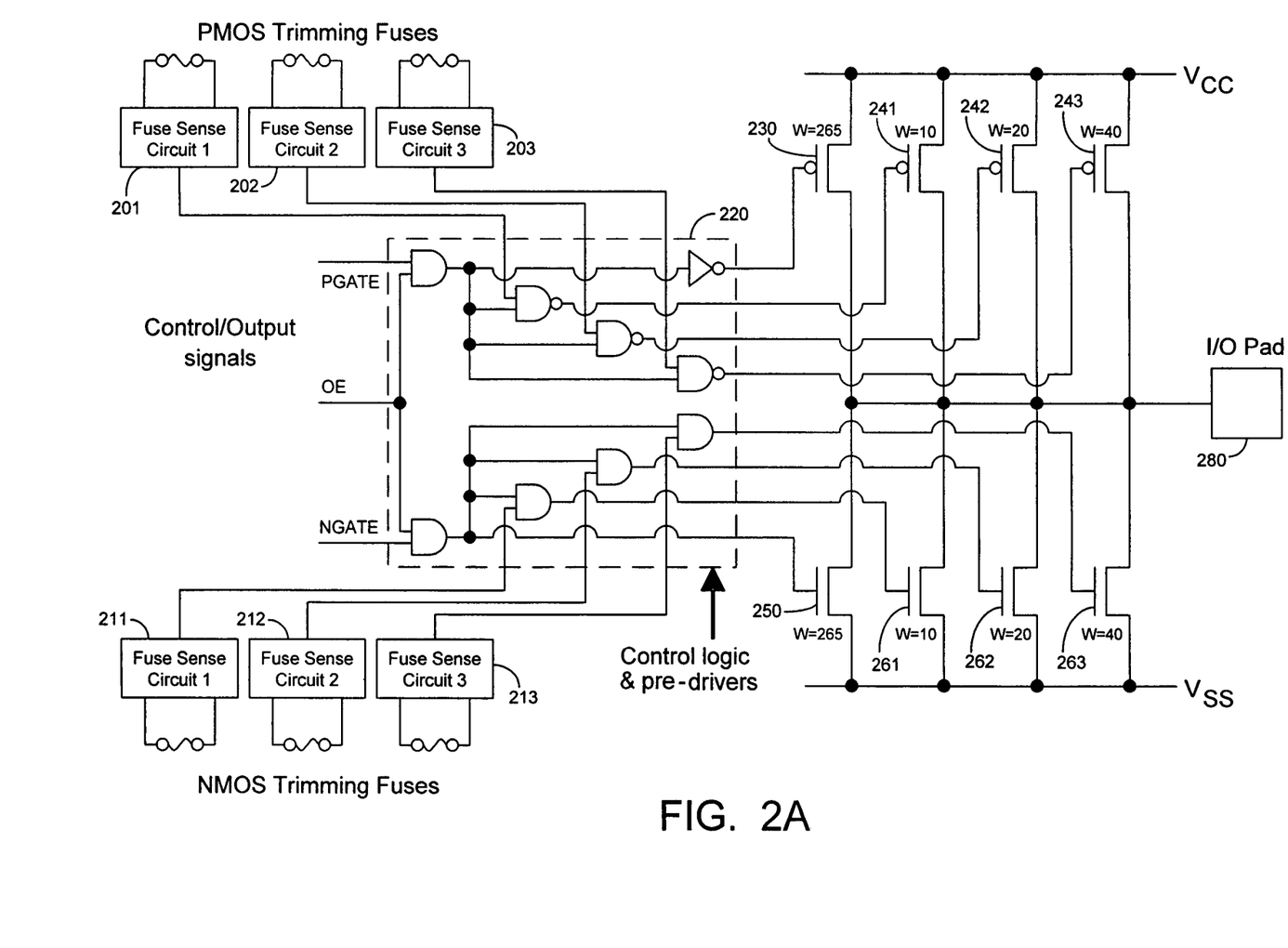
FIGS. 2A-2B illustrate output drivers with an adjustable drive current according to additional embodiments of the present invention.

FIG. 2A illustrates an output driver with an adjustable drive current according to a second embodiment of the present invention. The embodiment of FIG. 2A includes six fuse sense circuits 201, 202, 203, 211, 212, and 213. Each of the fuse sense circuits is coupled to a corresponding fuse. FIG. 2A also illustrates control logic and pre-driver block 220, main output drive transistors 230 and 250, output pad 280, and trimming transistors 241, 242, 243, 261, 262, and 263.

The drive and trimming transistor widths are shown in FIG. 2A in micrometers (μm). Transistor 230 has a width of 265 μm. The width of the pull up transistors can be increased by 10 μm by enabling transistor 241, 20 μm by enabling transistor 242, or 40 μm by enabling transistor 243. Alternatively, the width of the pull up transistors can be increased by 70 μm by enabling all three of transistors 241-243. Other combinations are possible for enabling one or more of trimming transistors 241-243. The width of the pull down transistors can also be increased by a corresponding amount by enabling the corresponding trimming transistors 261-263.

Block 220 includes several AND and NAND gates as well as an inverter. Two of the AND gates are coupled to receive output signal OE and control signals PGATE and NGATE. Signal OE is a data output enable signal. Signals PGATE and NGATE enable the pull-up and pull-down transistors, respectively.

The output signal of each fuse sense circuit is coupled to an input of one of the NAND or AND gates. Block 220 is one simplified example of a control logic and pre-driver circuit block that can be used with embodiments of the present invention. In addition, many other circuit designs for control and pre-driver blocks can adequately perform the functions of control logic and pre-driver block 220.

When the fuse coupled to fuse sense circuit 201 is blown, block 220 enables pull-up trimming transistor 241 to be turned on or off by the pre-driver. If the fuse coupled to circuit 201 is not blown, block 220 disables trimming transistor 241. In a similar fashion, fuse sense circuits 202, 203, 211, 212 and 213 control whether trimming transistors 242, 243, 261, 262, and 263, respectively, are enabled or disabled.

Figure 2B:
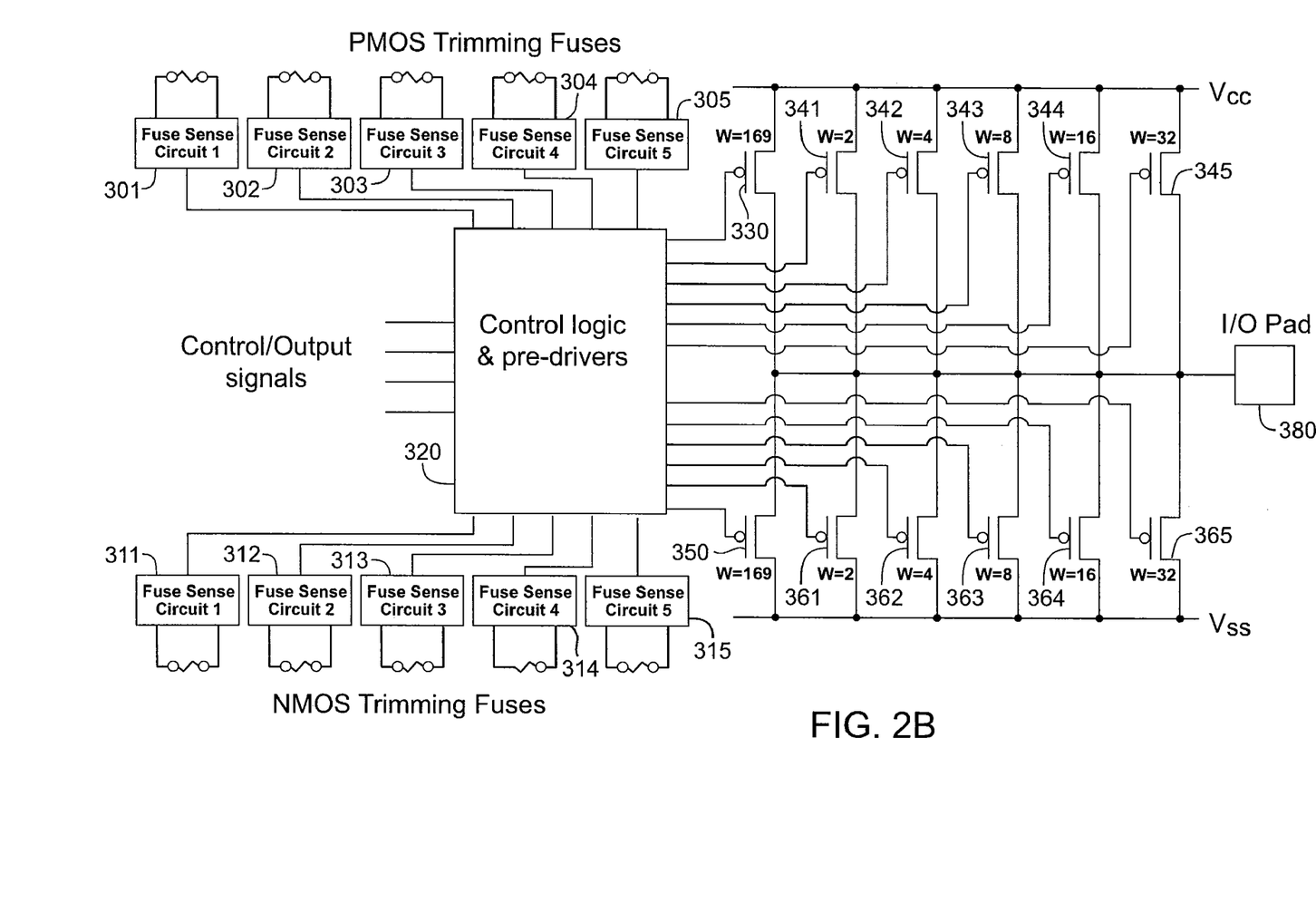

FIG. 2B illustrates another output driver with an adjustable drive current according to a third embodiment of the present invention. The output driver of FIG. 2B includes fuse sense circuits 301-305 and 311-315. Each of the fuse sense circuits is coupled to a corresponding fuse. FIG. 2B also illustrates control logic and pre-driver block 320, main output drive transistors 330 and 350, output pad 380, and trimming transistors 341-345 and 361-365. The drive and trimming transistor widths are shown in FIG. 2B in micrometers (μm). Any combination of one or more of the trimming transistors can be enabled to achieve a desired increase in the drive current.

When the fuse coupled to fuse sense circuit 301 is blown, block 320 enables pull-up trimming transistor 341 to be turned on or off by the pre-driver. If the fuse coupled to circuit 301 is not blown, block 320 disables trimming transistor 341. In a similar fashion, fuse sense circuits 302-305 and 311-315 control whether trimming transistors 342-345 and 361-365, respectively, are enabled or disabled.

The structure shown in FIG. 2A enables the effective output driver transistor width to be varied from 265 μm to 335 μm in 10 μm increments. This structure has the ability to reduce a +/−10% process variation to less than +/−2%. The structure shown in FIG. 2B has the ability to reduce +/−10% process variation to +/−0.5% by allowing the effective output transistor width to be varied from 169 μm to 231 μm in 2 μm increments. The average range and increment of the output transistor widths can be easily designed to meet the specific requirements for an I/O standard by selecting appropriate values for the main output drive transistor widths, the trimming transistor widths, and the number of enabled trimming transistors.

The present invention can compensate for process variations, model inaccuracies, and an off-target process to produce I/O drive current that is on target with a much tighter distribution. The present invention allows the I/O characteristics to be tuned based on the processing conditions seen by each individual die. The present invention can also be used to minimize I/O drive current variations across a die by tuning individual I/O drivers within the same die.

The actual output drive currents generated by output drivers on a die are measured at wafer sort or during a final test. Based on the measured output drive currents, an algorithm is used to calculate the total transistor width that is required in the output driver to meet a required I/O standard. Once the total transistor width has been calculated, fuses can be blown on the die to enable enough of the trimming transistors to meet the required drive current strength.

Figure 3A:
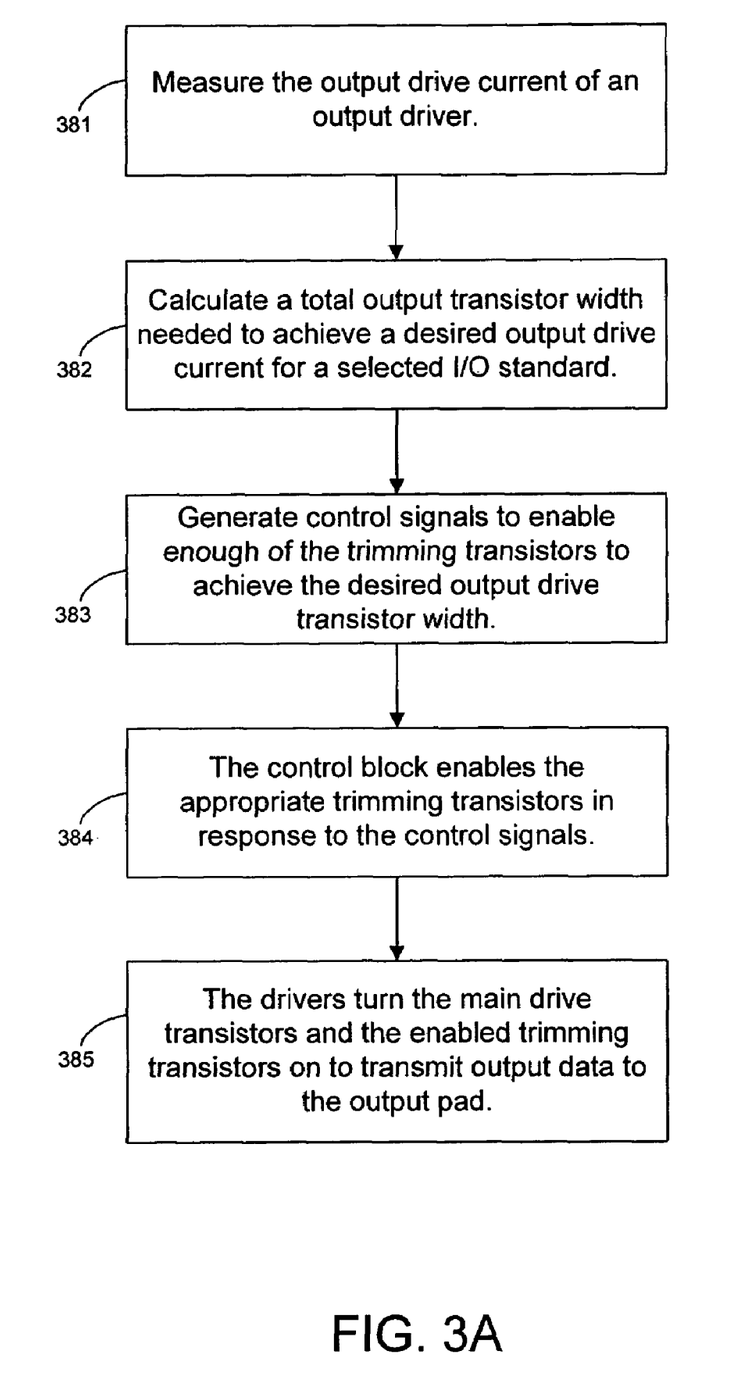
FIG. 3A is a flow chart that illustrates a methodology for adjust the drive current strength of output driver according to an embodiment of the present invention.

FIG. 3A illustrates a methodology for adjusting the drive current strength of an output driver according to an embodiment of the present invention. At step 381, the drive current of an output driver is measured, e.g., at wafer sort or during a final test. At step 382, a calculation is performed to determine the total output transistor width needed to achieve a desired output drive current for a selected I/O standard. At step 383, control signals are generated on the die to enable enough trimming transistors to achieve the desired output drive transistor width, as described above. At step 384, the control block enables the appropriate trimming transistors in response to the control signals. At step 385, drivers turn on the main drive transistors and the enabled trimming transistors to transmit output data to the output pad.

Figure 3B:
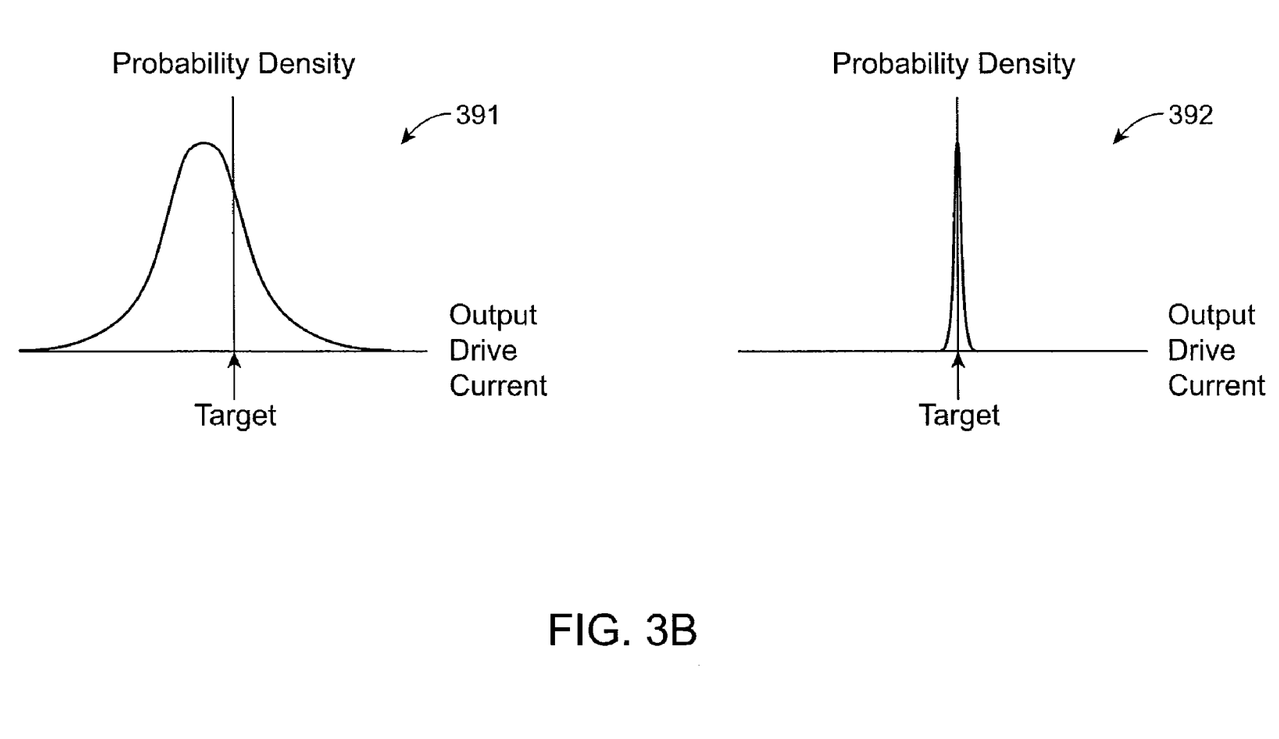
FIG. 3B shows two graphs that illustrate the output drive current of a prior art output driver and an output driver of the present invention.

FIG. 3B illustrates the improvement in output drive current distribution that can be obtained with the present invention (shown in graph 392) compared with the prior art (shown in graph 391).

Figure 4:
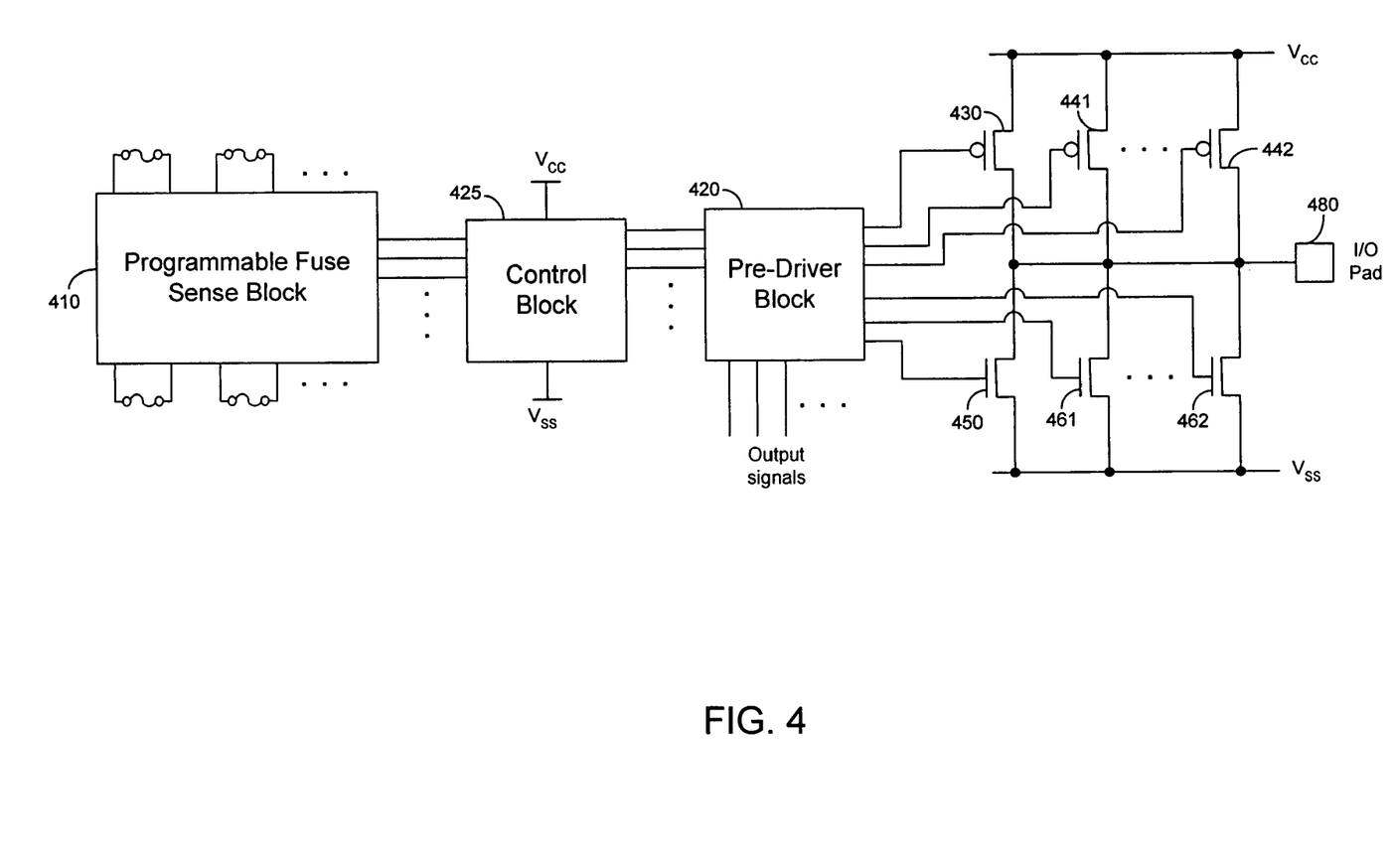
FIGS. 4-6 illustrate output drivers with adjustable drive currents according to further embodiments of the present invention.

According to an alternative implementation of the present invention, the fuses are read by a programmable fuse sense block 410 in a programmable logic integrated circuit. FIG. 4 illustrates an output driver on a programmable logic integrated circuit. The embodiment of FIG. 4 includes programmable fuse sense block 410, pre-driver 420, control block 425, main drive transistors 430 and 450, I/O pad 480, and trimming transistors 441-442 and 461-462. Block 410 includes programmable logic that is configured as fuse sense circuitry to sense the states of the fuses.

The configuration of the output driver can be set by control block 425 to enable the appropriate trimming transistors 441-442 and 461-462 in response to the state of the corresponding fuse. The trimming transistors are enabled and disabled by programmable logic circuits in control block 425. The programmable logic circuits couple the gates of the trimming transistors to signals that control the turn on and turn off of these transistors. The p-channel trimming transistors are disabled by coupling their gates to the high supply voltage ($V_{CC}$). The n-channel trimming transistors are disabled by coupled their gates to the low supply voltage ($V_{SS}$).

According to an alternate embodiment of the present invention, the fuse sense circuits are replaced with anti-fuse sense circuits that are coupled to anti-fuses. An anti-fuse can include, for example, an on-chip transistor that is disabled by driving a large current through the transistor.

Figure 5:
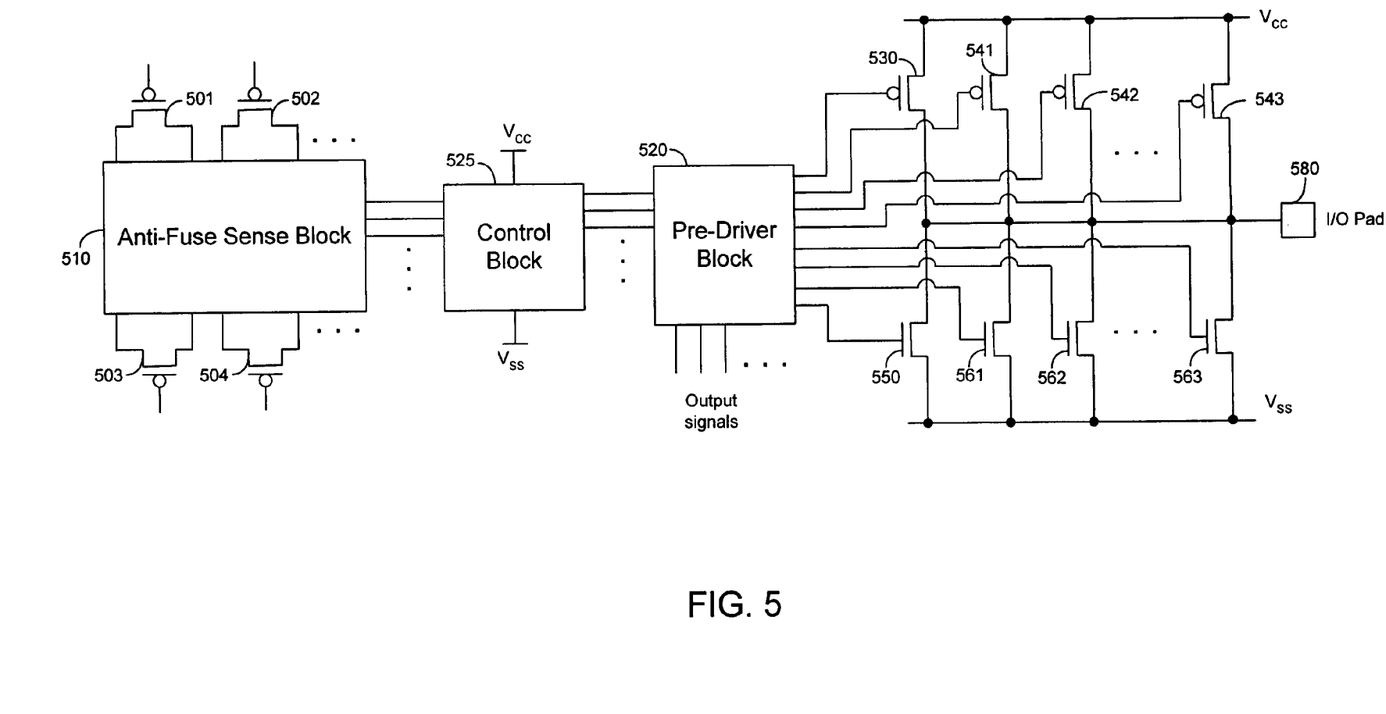

FIG. 5 illustrates an example of an embodiment of the present invention that is responsive to anti-fuses. One type of anti-fuse that can be used with the present invention is a transistor anti-fuse that operates on the principal of gate oxide rupture. A high voltage is applied between the gate and source/drain to break down the gate oxide. Before programming, the transistor anti-fuse has very high resistance between gate and source/drain. After programming, the transistor anti-fuse has a low resistance between the gate and source/drain. This type of anti-fuse is merely one example. Other types of fuses and anti-fuses can be used with the present invention.

Anti-fuse sense block 510 senses the conductivity states of transistor anti-fuses. In FIG. 5, sense block 510 is coupled to anti-fuses 501-504. An anti-fuse sense block of the present invention can be coupled to any suitable number of anti-fuses.

Anti-fuse sense block 510 generates control signals in response to the states of the anti-fuses. The control signals are transmitted to control block 525. Control block 525 enables or disables drivers in block 520 that control the trimming transistors in response to the control signals from block 510. Each of the drivers controls a corresponding main drive or trimming transistor.

In FIG. 5, transistors 530 and 550 are the main drive transistors, and transistors 541-543 and 561-563 are six of the trimming transistors. Although six trimming transistors are shown in FIG. 5, it should be understood that any number of trimming transistors can be provided to control the drive current to pad 580.

Figure 6:
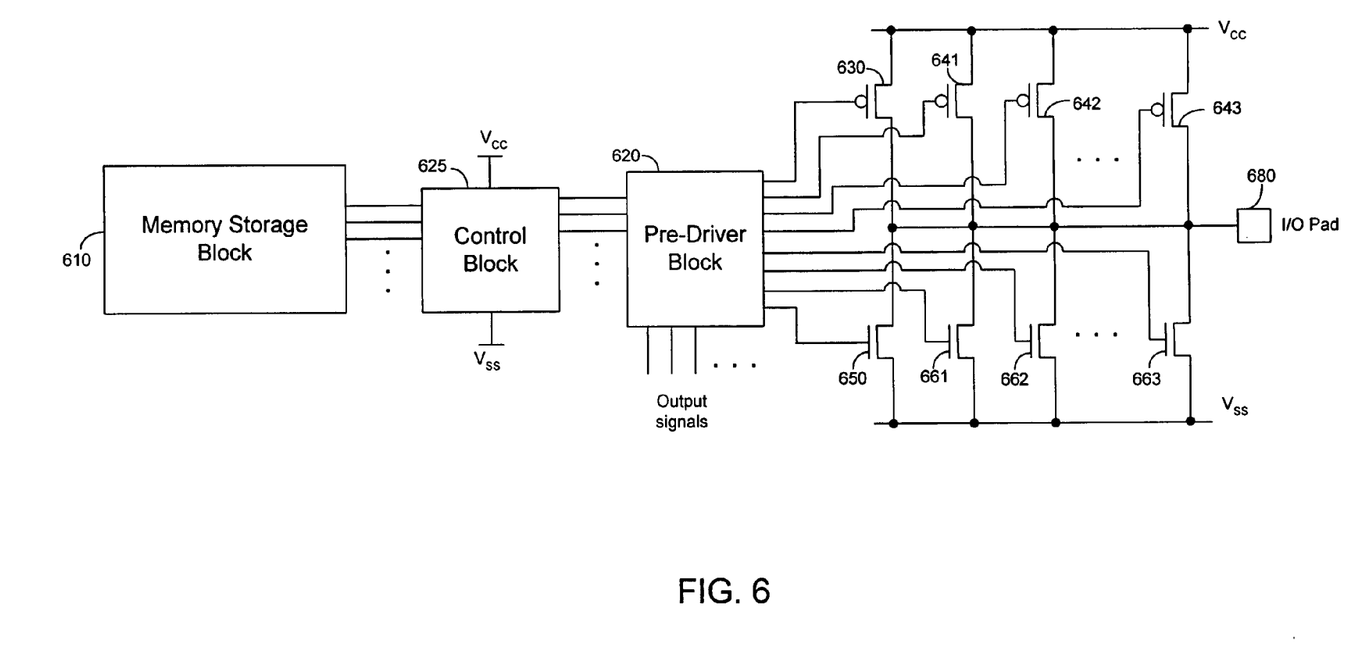

According to another embodiment of the present invention, the fuse sense circuits are replaced with non-volatile memory circuits. FIG. 6 illustrates an example of an embodiment of the present invention that is responsive to non-volatile memory. Memory storage block 610 includes non-volatile memory cells such as EEPROM, Flash, fero-RAM (FRAM), or magnetic RAM (MRAM). Memory storage block 610 can be an on-chip or off-chip circuit block. The memory cells are programmed with bits that indicate which of the trimming transistors will be enabled.

Memory block 610 outputs the stored bits to control block 625. Control block 625 enables or disables drivers in block 620 that control the trimming transistors in response to the state of the stored bits. Each of the drivers controls a corresponding main drive or trimming transistor.

In FIG. 6, transistors 630 and 650 are the main drive transistors, and transistors 641-643 and 661-663 are six of the trimming transistors. Although six trimming transistors are shown in FIG. 6, it should be understood that any number of trimming transistors can be provided to control the drive current to pad 680.

The techniques of the present invention can be used to adjust the drive current of a group of I/O drivers on a die based on a single I/O measurement or on multiple I/O measurements. According to one embodiment, one control block controls the drive current in a group of I/O drivers on a die as shown in FIG. 7A.

Figure 7A:
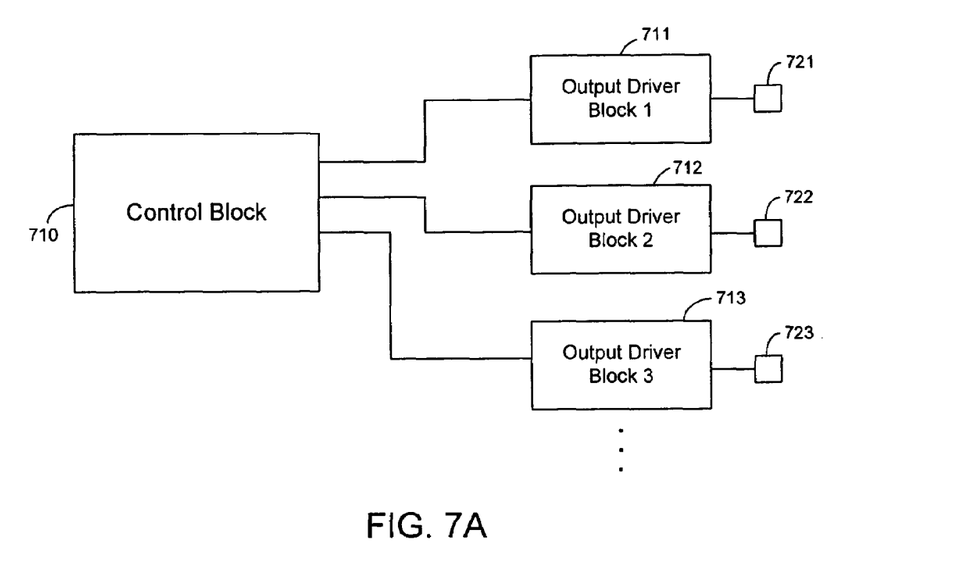
FIGS. 7A-7B illustrates adjustable drive current output drivers controlled by different control block configurations, according to further embodiments of the present invention.

Referring to FIG. 7A, one control block 710 controls output drivers 711-713 on the die. Output drivers 711-713 include the pre-drivers, the main driver transistors, and the trimming transistors. Output drivers 711-713 are coupled to I/O pads 721-723, respectively. Control block 710 can also control all the output drivers on a die.

Figure 7B:
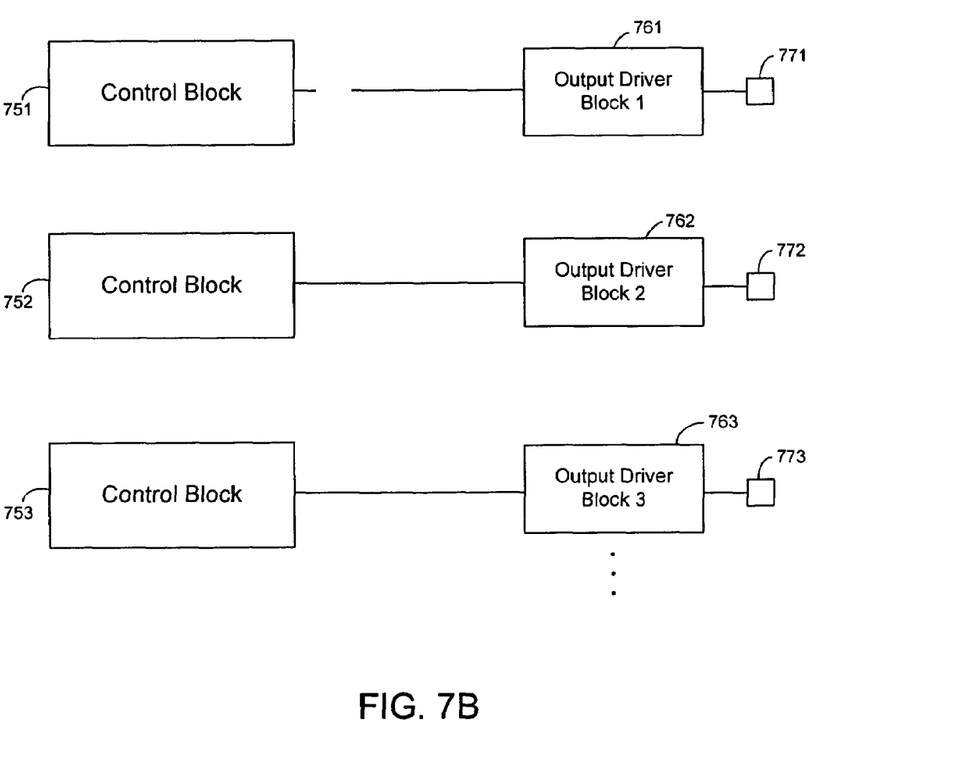

The techniques of the present invention can also be used to adjust the drive current in each I/O on a die individually based on its own drive current characteristics. In this embodiment, separate control blocks are used control to each I/O driver on the die as shown in FIG. 7B. Referring to FIG. 7B, separate control blocks 751-753 control each output driver block 761-763, respectively. Output driver blocks 761-763 are coupled to I/O pads 771-773, respectively.

Figure 8:
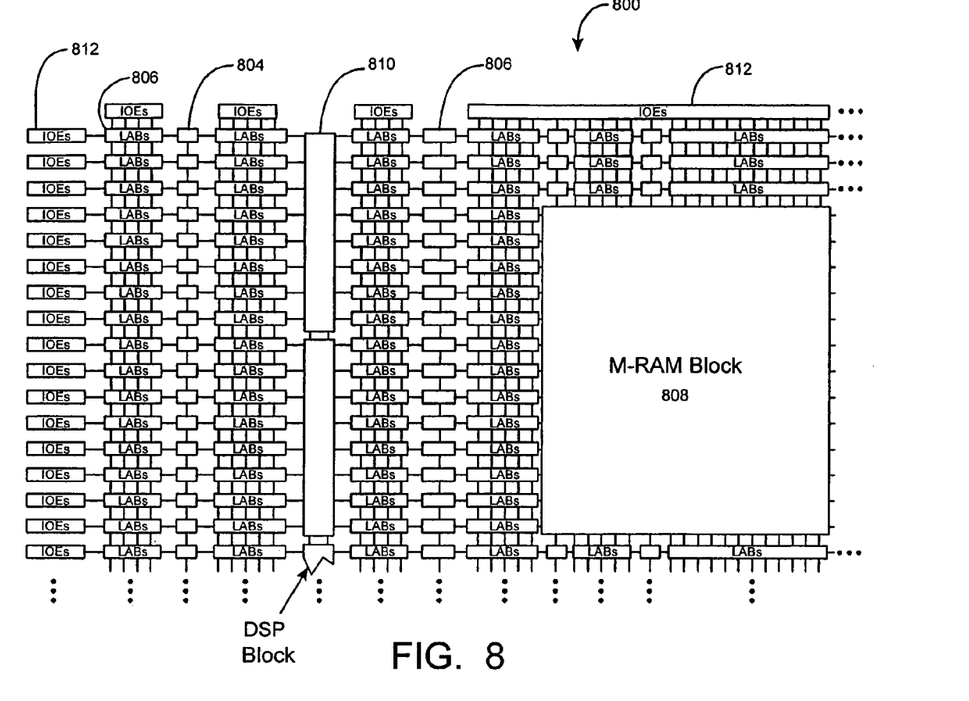
FIG. 8 is a simplified block diagram of a programmable logic device that can be used with the techniques of the present invention.

FIG. 8 is a simplified partial block diagram of an example of a PLD 800. It should be understood that the present invention can be used on any of the numerous types of programmable integrated circuits. PLD 800 is an example of a programmable logic integrated circuit for which techniques of the present invention can be implemented. PLD 800 includes a two-dimensional array of programmable logic array blocks (or LABs) 802 that are interconnected by a network of column and row interconnects of varying length and speed. LABs 802 include multiple (e.g., 10) logic elements (or LEs).

An LE is a programmable logic block that provides for efficient implementation of user defined logic functions. PLD 800 has numerous logic elements that can be configured to implement various combinatorial and sequential functions. The logic elements have access to a programmable interconnect structure. The programmable interconnect structure can be programmed to interconnect the logic elements in almost any desired configuration.

PLD 800 also includes a distributed memory structure including RAM blocks of varying sizes provided throughout the array. The RAM blocks include, for example, 512 bit blocks 804, 4K blocks 806 and a block 808 that provides 512K bits of RAM. These memory blocks can also include shift registers and FIFO buffers.

PLD 800 further includes digital signal processing (DSP) blocks 810 that can implement, for example, multipliers with add or subtract features. I/O elements (IOEs) 812 located, in this example, around the periphery of the device support numerous single-ended and differential I/O standards. It is to be understood that PLD 800 is described herein for illustrative purposes only and that the present invention can be evaluate many different types of PLDs, FPGAs, and the like.

Figure 9:
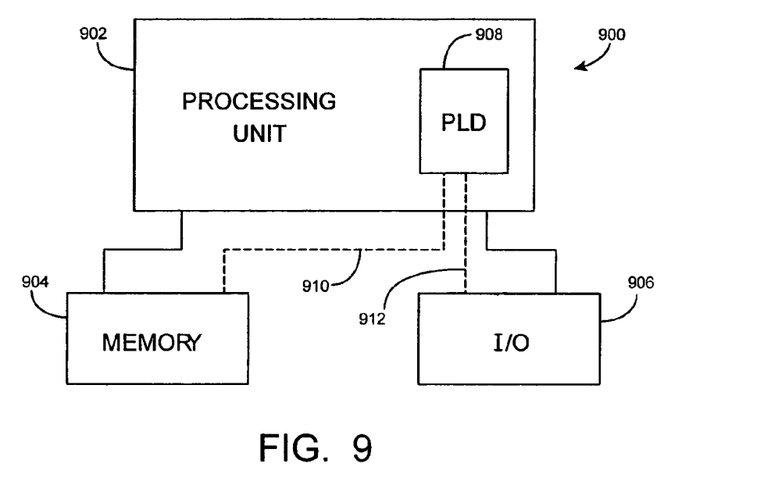
FIG. 9 is a block diagram of an electronic system that can implement embodiments of the present invention.

While PLDs of the type shown in FIG. 8 provide many of the resources required to implement system level solutions, the present invention can also benefit systems wherein a PLD is one of several components. FIG. 9 shows a block diagram of an exemplary digital system 900, for which the present invention can be implemented. System 900 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 900 can be provided on a single board, on multiple boards, or within multiple enclosures.

System 900 includes a processing unit 902, a memory unit 904 and an I/O unit 906 interconnected together by one or more buses. According to this exemplary embodiment, a programmable logic device (PLD) 908 is embedded in processing unit 902. PLD 908 can serve many different purposes within the system in FIG. 9. PLD 908 can, for example, be a logical building block of processing unit 902, supporting its internal and external operations. PLD 908 is programmed to implement the logical functions necessary to carry on its particular role in system operation. PLD 908 can be specially coupled to memory 904 through connection 910 and to I/O unit 906 through connection 912.

Processing unit 902 can direct data to an appropriate system component for processing or storage, execute a program stored in memory 904 or receive and transmit data via I/O unit 906, or other similar function. Processing unit 902 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 908 can control the logical operations of the system. In an embodiment, PLD 908 acts as a reconfigurable processor, which can be reprogrammed as needed to handle a particular computing task. Alternately, programmable logic device 908 can itself include an embedded microprocessor. Memory unit 904 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. An integrated circuit comprising:
    a first pull-up device coupled between a pad and a first supply voltage;
    a second pull-up device coupled between the pad and the first supply voltage;
    a first pull-down device coupled between the pad and a second supply voltage;
    a second pull-down device coupled between the pad and the second supply voltage;
    a first predriver coupled to receive a first data output signal and to drive the first pull-up device;
    a second predriver coupled to receive a first control signal and the first data output signal and to drive the second pull-up device, wherein when the first control signal is in a first state, the second pull-up device is enabled, and when the first control signal is in a second state, the second pull-up device is disabled;
    a third predriver coupled to receive a second data output signal and to drive the first pull-down device;
    a fourth predriver coupled to receive a second control signal and the second data output signal and to drive the second pull-down device;
    a first fuse to generate the first control signal; and
    a second fuse to generate the second control signal.

2. The integrated circuit of claim 1 wherein when the second control signal is in the first state, the second pull-down device is enabled, and when the second control signal is in the second state, the second pull-down device is disabled.

3. The integrated circuit of claim 1 further comprising:
    a first fuse sense circuit to sense the first fuse; and
    a second fuse sense circuit to sense the second fuse.

4. The integrated circuit of claim 1 further comprising:
    a plurality of programmable logic elements configurable to implement user defined functions and coupled to provide the first data output signal and the second data output signal.

5. The integrated circuit of claim 1 wherein the integrated circuit is a field programmable gate array.

6. The integrated circuit defined in claim 1 further comprising:
    a fuse sense circuit coupled to sense current through the first fuse and to provide the first control signal to the first predriver.

7. The integrated circuit defined in claim 1 further comprising:
    a fuse sense circuit coupled to sense current through the first fuse and to provide the first control signal to the second predriver to enable the second pull-up device when the fuse sense circuit senses that the first fuse is blown.

8. The integrated circuit defined in claim 1 further comprising:
    a first fuse sense circuit coupled to sense current through the first fuse and to provide the first control signal to the second predriver; and
    a second fuse sense circuit coupled to sense current through the second fuse and to provide the second control signal to the fourth predriver.

9. An integrated circuit comprising:
    a first pull-up device coupled between a pad and a first supply voltage;
    a second pull-up device coupled between the pad and the first supply voltage;
    a first pull-down device coupled between the pad and a second supply voltage;
    a second pull-down device coupled between the pad and the second supply voltage;
    a first predriver coupled to receive a first data output signal and to drive the first pull-up device;
    a second predriver coupled to receive a first control signal and the first data output signal and to drive the second pull-up device, wherein when the first control signal is in a first state, the second pull-up device is enabled, and when the first control signal is in a second state, the second pull-up device is disabled;
    a third predriver coupled to receive a second data output signal and to drive the first pull-down device;
    a fourth predriver coupled to receive a second control signal and the second data output signal and to drive the second pull-down device;
    a first memory cell to generate the first control signal; and
    a second memory cell to generate the second control signal.

10. The integrated circuit of claim 9 wherein when the second control signal is in the first state, the second pull-down device is enabled, and when the second control signal is in the second state, the second pull-down device is disabled.

11. The integrated circuit of claim 9 further comprising:
    plurality of programmable logic elements configurable to implement user defined functions and coupled to provide the first data output signal and the second data output signal.

12. The integrated circuit of claim 9 wherein the integrated circuit is a field programmable gate array.

13. An integrated circuit comprising:
    a first pull-up transistor coupled between a pad and a first supply terminal;
    a first pull-down transistor coupled between the pad and a second supply terminal;
    a second pull-up transistor coupled between the pad and the first supply terminal;
    a second pull-down transistor coupled between the pad and the second supply terminal;
    a control circuit to receive an input signal and an enable signal, wherein the control circuit includes predrivers for each of the first and second pull-up transistors and the first and second pull-down transistors;
    a first fuse sense circuit coupled to sense current through a first fuse and to provide a first control signal to the control circuit; and a second fuse sense circuit coupled to sense current through a second fuse and to provide a second control signal to the control circuit, wherein when the enable signal is in an enable state, the first control signal enables or disables the second pull-up transistor and the second control signal enables or disables the second pull-down transistor, and wherein when the enable signal is in a disable state, the second pull-up transistor and the second pull-down transistor are disabled.

14. The integrated circuit of claim 13 further comprising a plurality of programmable logic elements, wherein the plurality of programmable logic elements provides the input signal and the enable signal.

15. The integrated circuit of claim 13 wherein the first supply terminal receives a positive voltage and the second supply terminal receives ground.

16. An integrated circuit comprising:
a first pull-up transistor coupled between a pad and a first supply terminal;
a first pull-down transistor coupled between the pad and a second supply terminal;
a second pull-up transistor coupled between the pad and the first supply terminal;
a second pull-down transistor coupled between the pad and the second supply terminal;
a control circuit to receive an input signal and an enable signal, wherein the control circuit includes predrivers for each of the first and second pull-up transistors and the first and second pull-down transistors;
a first fuse to provide a first control signal to the control circuit; and
a second fuse to provide a second control signal to the control circuit,
wherein when the enable signal is in an enable state, the first control signal enables or disables the second pull-up transistor and the second control signal enables or disables the second pull-down transistor, and
wherein when the enable signal is in a disable state, the second pull-up transistor and the second pull-down transistor are disabled.

17. The integrated circuit of claim 16 further comprising a plurality of programmable logic elements, wherein the plurality of programmable logic elements provides the input signal and the enable signal.

18. The integrated circuit of claim 16 wherein the first supply terminal receives a positive voltage and the second supply terminal receives ground.

* * * * *